(12) United States Patent
Goda

(10) Patent No.: US 7,642,616 B2
(45) Date of Patent: Jan. 5, 2010

(54) TUNNEL AND GATE OXIDE COMPRISING NITROGEN FOR USE WITH A SEMICONDUCTOR DEVICE AND A PROCESS FOR FORMING THE DEVICE

(75) Inventor: Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/749,980

(22) Filed: May 17, 2007

(65) Prior Publication Data

US 2008/0286919 A1    Nov. 20, 2008

(51) Int. Cl.
*H01L 21/8238* (2006.01)
(52) U.S. Cl. .................................. 257/501; 438/211
(58) Field of Classification Search ............... 438/257, 438/275, 296, 424, 365, 500, 501
See application file for complete search history.

(56) References Cited

U.S. PATENT DOCUMENTS

| 5,661,072 | A |   | 8/1997  | Jeng |
| 6,734,510 | B2 |   | 5/2004  | Forbes et al. |
| 6,875,676 | B2 | * | 4/2005  | Wieczorek et al. .......... 438/585 |
| 7,126,181 | B2 |   | 10/2006 | Eppich et al. |
| 2003/0119255 | A1 | * | 6/2003  | Dong et al. .................. 438/257 |
| 2005/0023604 | A1 | * | 2/2005  | Kim et al. .................... 257/316 |
| 2006/0014360 | A1 | * | 1/2006  | Matsumoto ................. 438/424 |
| 2006/0220171 | A1 | * | 10/2006 | Choi et al. ................... 257/500 |
| 2008/0261367 | A1 | * | 10/2008 | Prinz et al. .................. 438/275 |

\* cited by examiner

*Primary Examiner*—David Vu
*Assistant Examiner*—Suberr Chi

(57) ABSTRACT

A method used during semiconductor device fabrication comprises forming at least two types of transistors. A first transistor type may comprise a CMOS transistor comprising gate oxide and having a wide active area and/or a long channel, and the second transistor type may comprise a NAND comprising tunnel oxide and having a narrow active area and/or short gate length. The transistors are exposed to a nitridation ambient which, due to their differences in sizing, results in nitridizing the tunnel oxide in its entirely but only partially nitridizing the gate oxide. Various process embodiments and completed structures are disclosed.

21 Claims, 10 Drawing Sheets

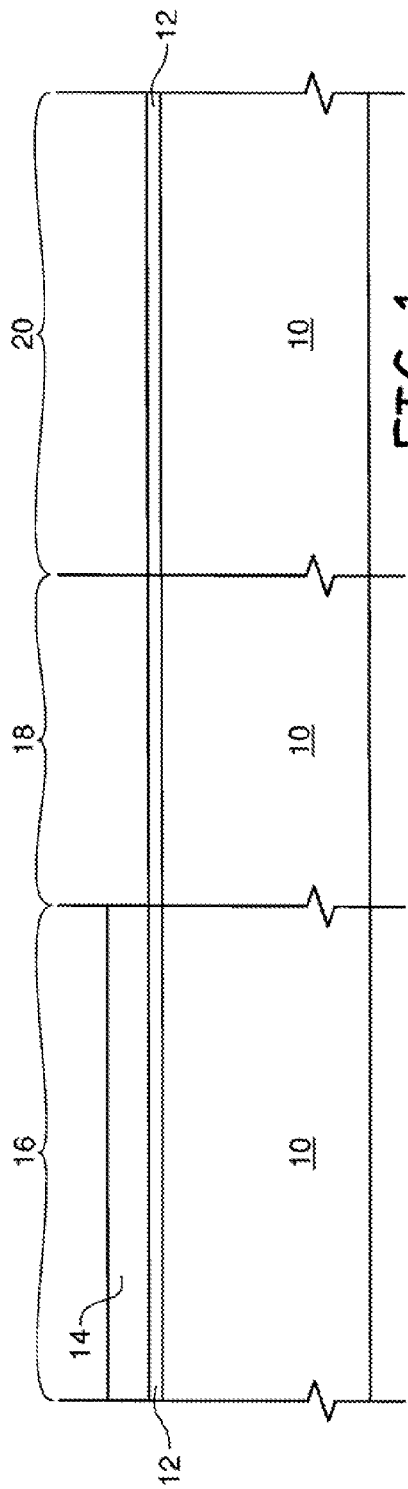
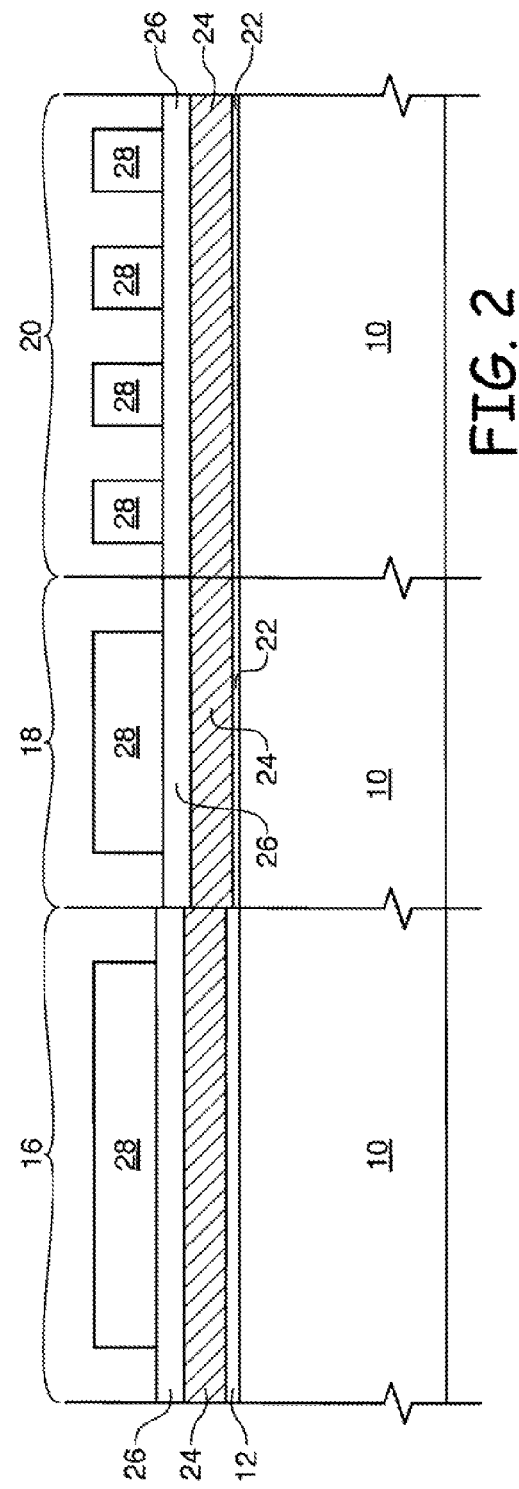

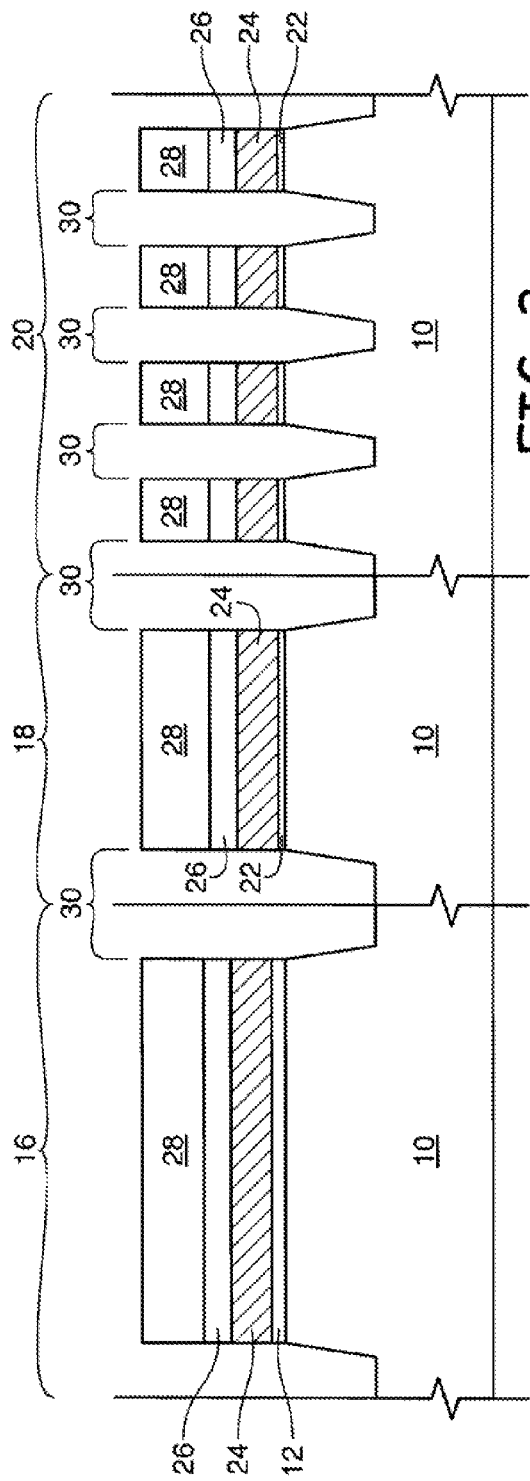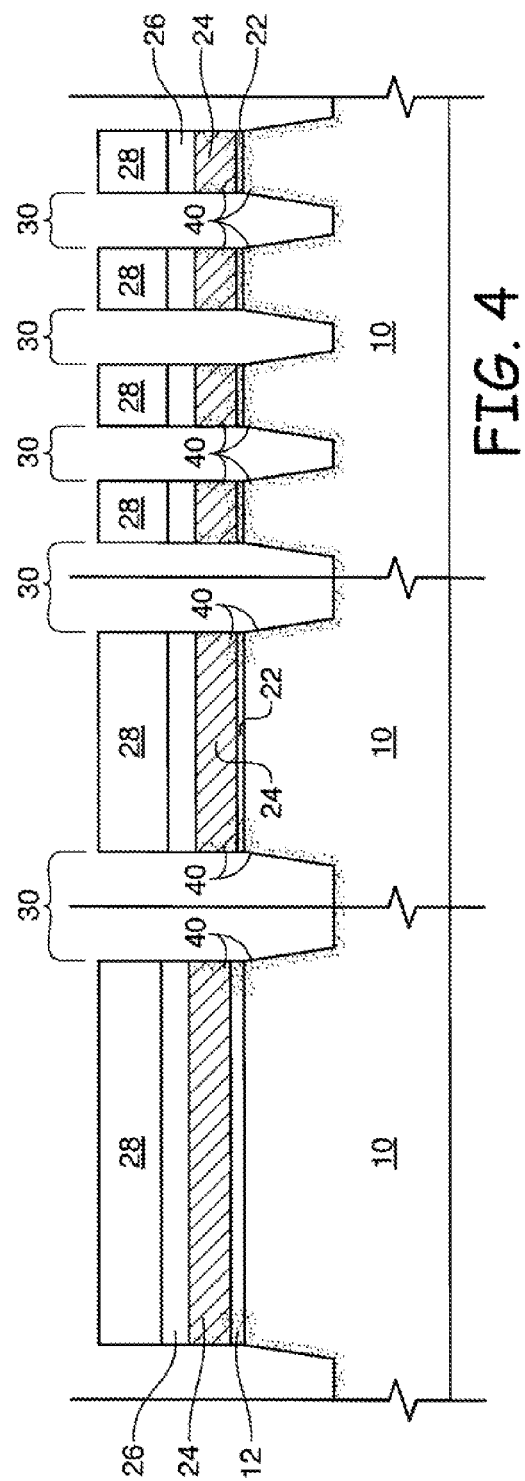

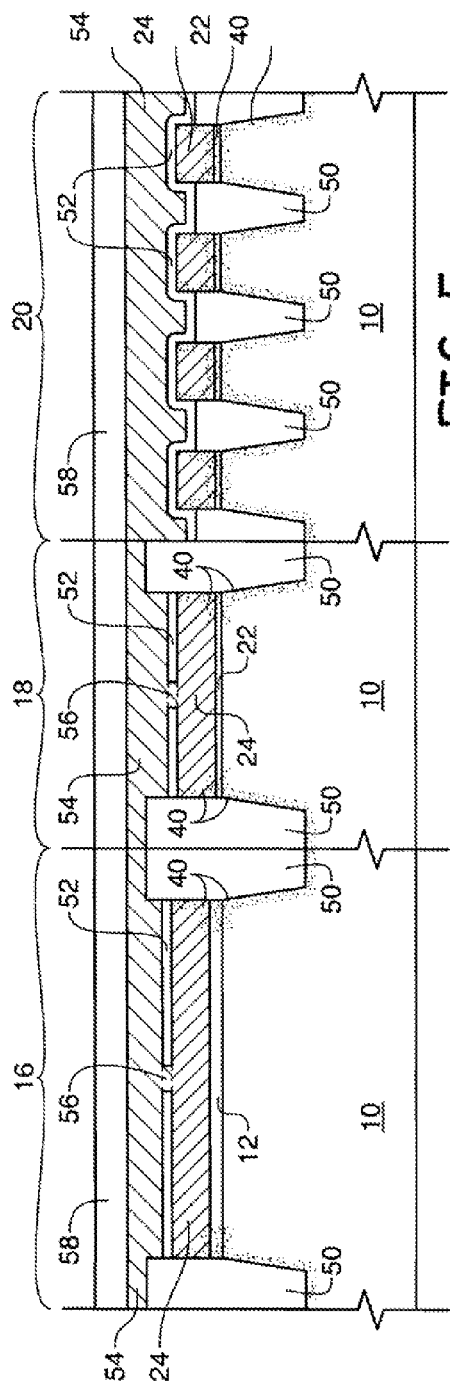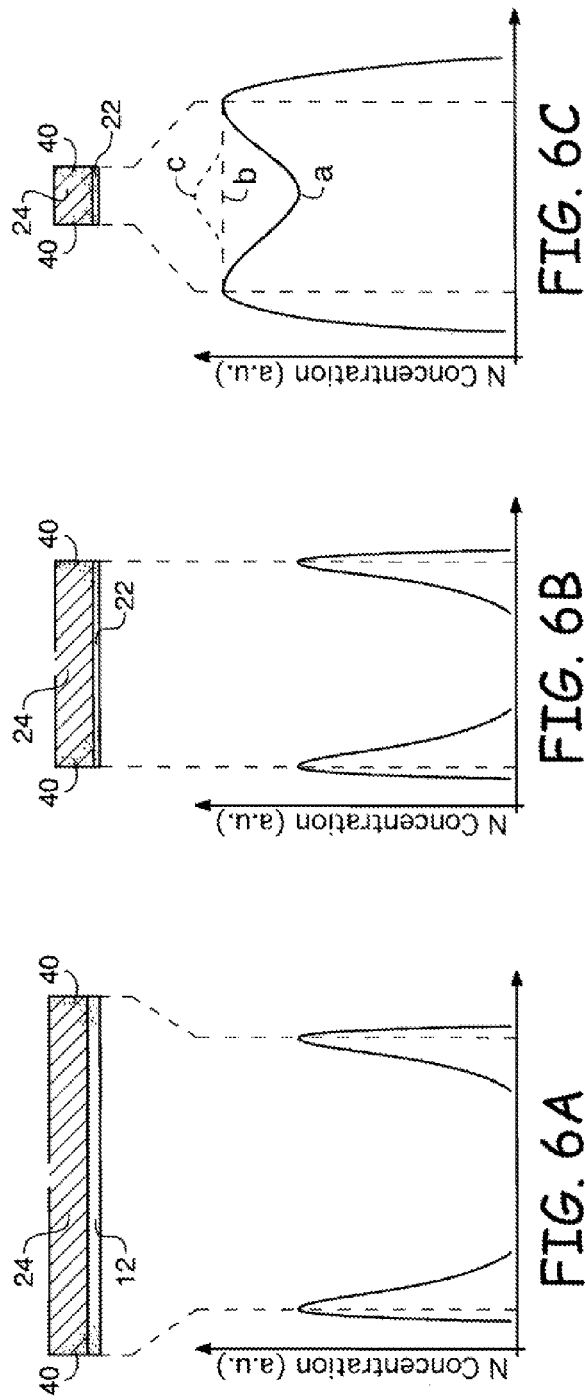

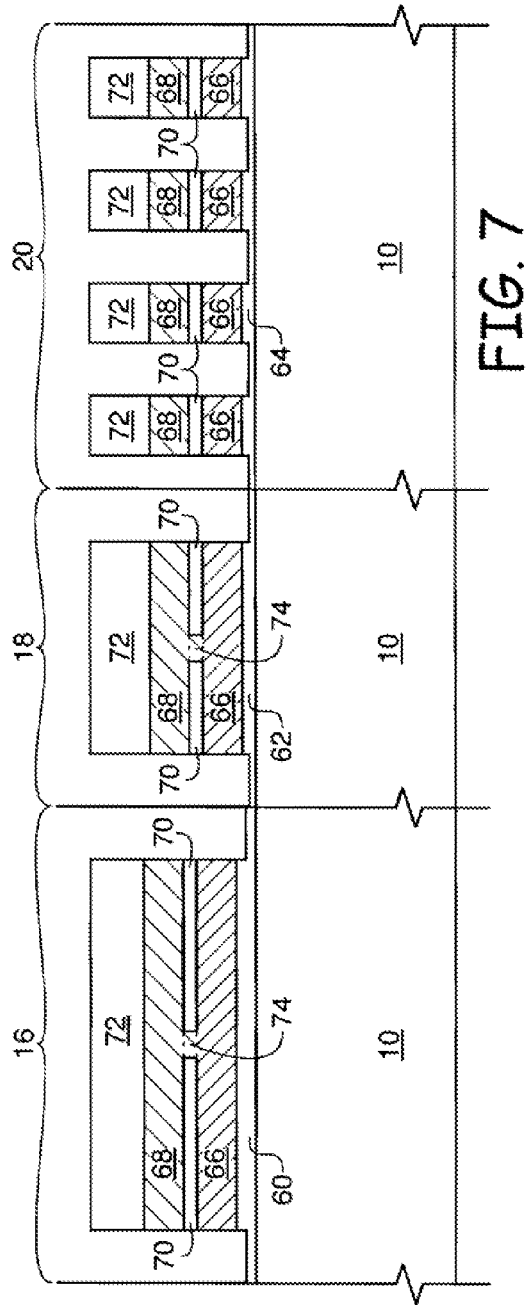
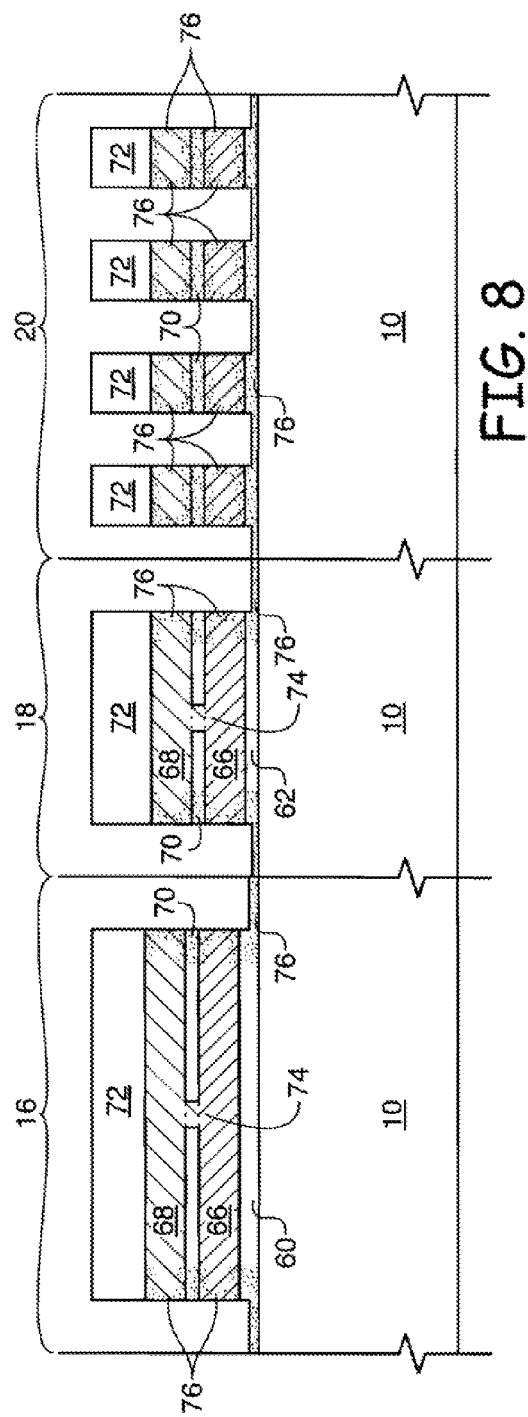

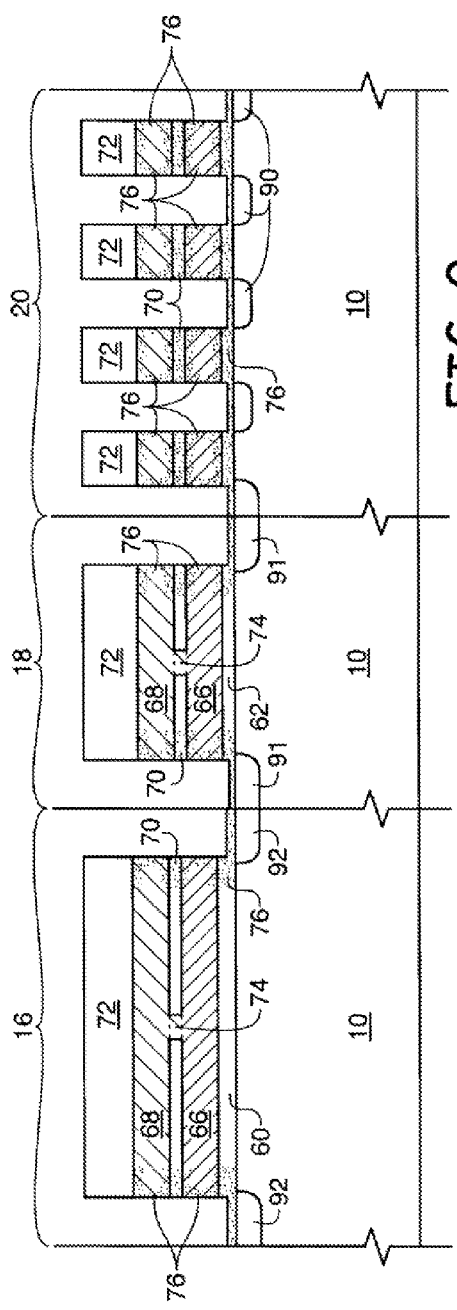
FIG. 9
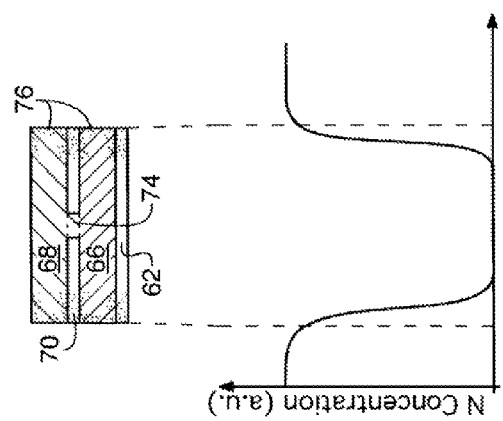
FIG. 10C
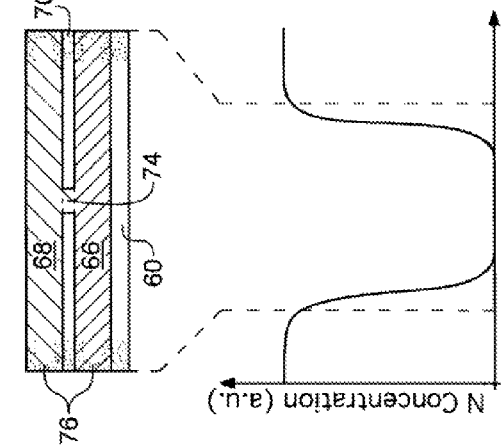
FIG. 10B
FIG. 10A

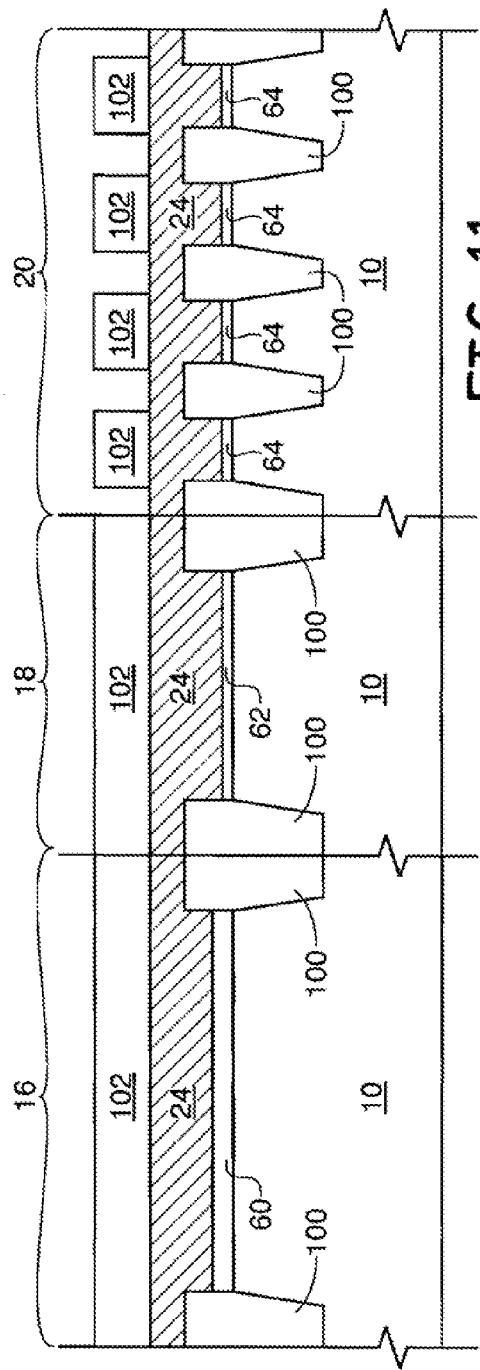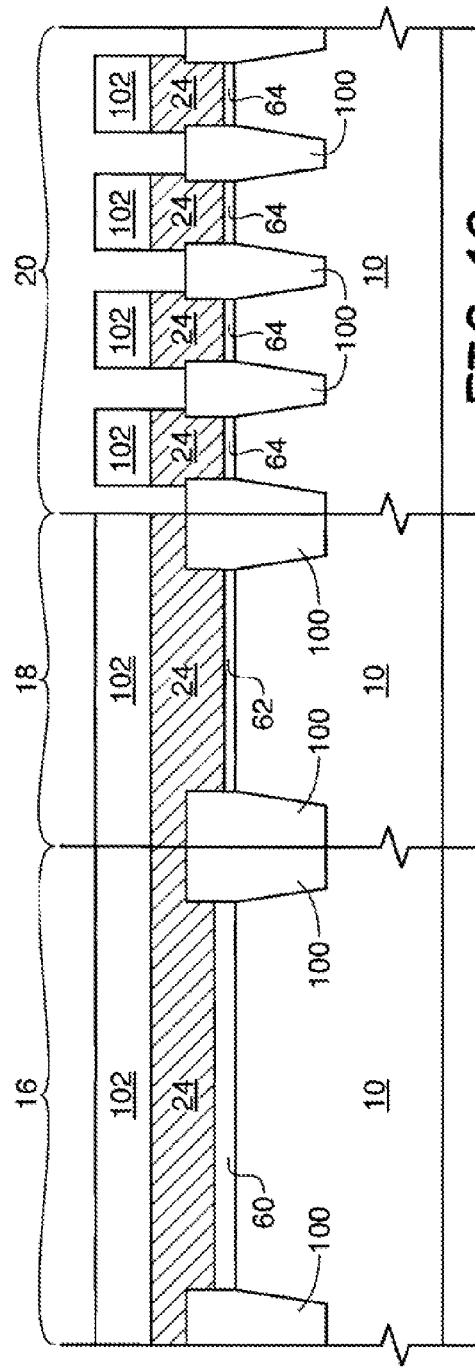

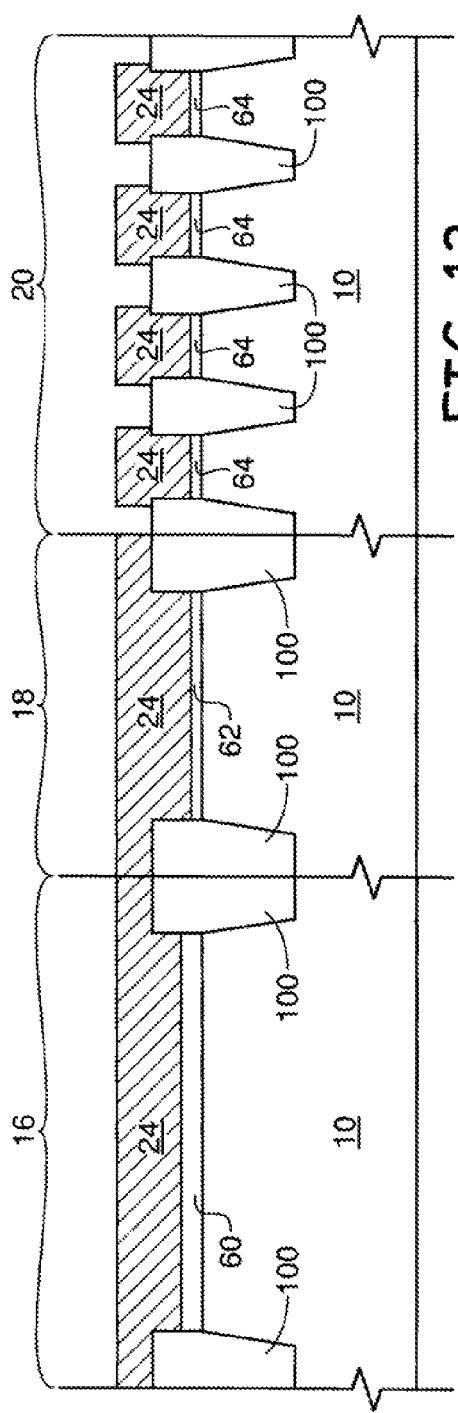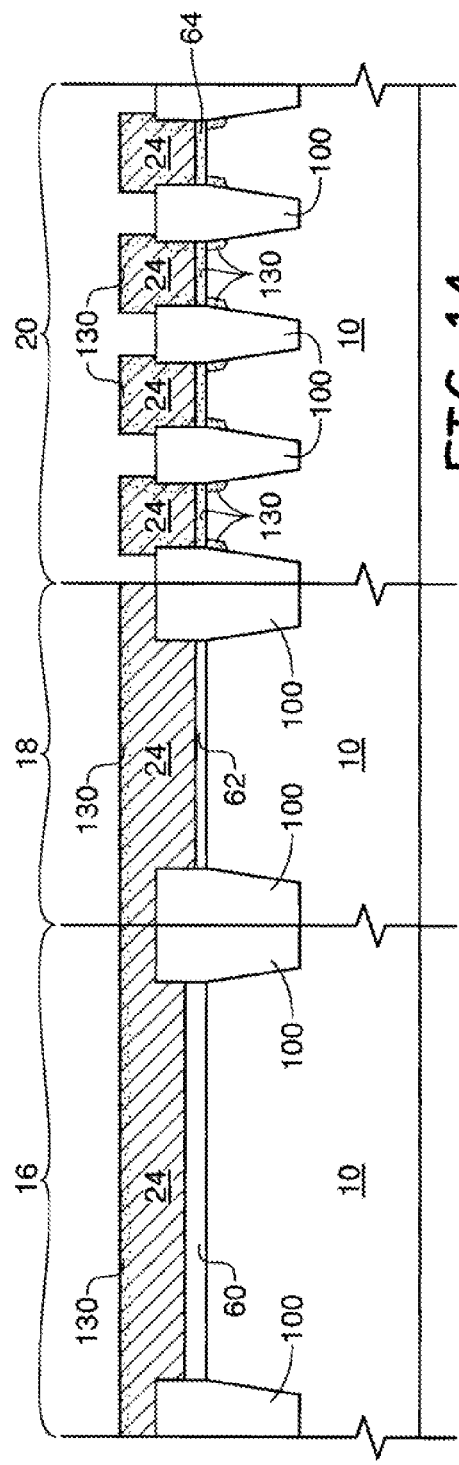

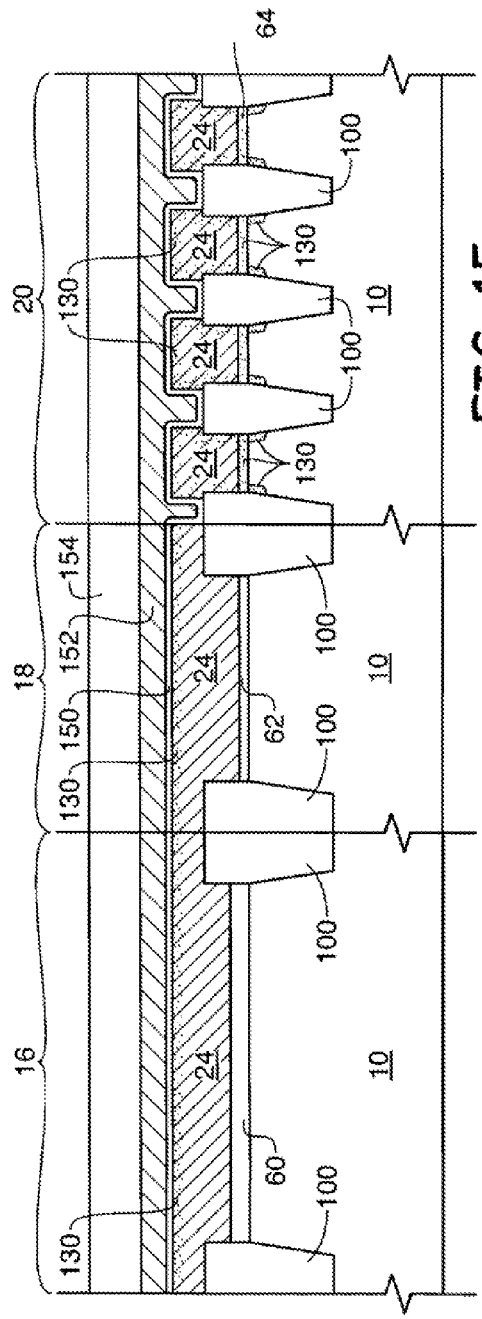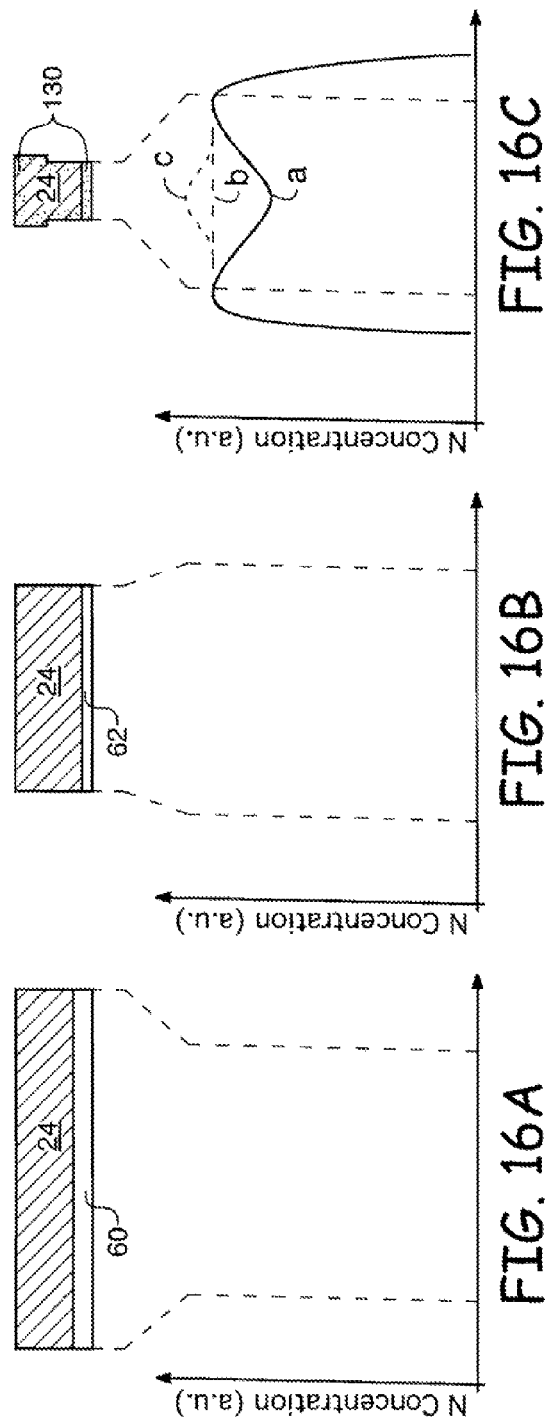

TUNNEL AND GATE OXIDE COMPRISING NITROGEN FOR USE WITH A SEMICONDUCTOR DEVICE AND A PROCESS FOR FORMING THE DEVICE

TECHNICAL FIELD

Embodiments of the present disclosure relate to the field of semiconductor manufacture and, more particularly, to a method for forming multiple device types which have different nitrogen concentrations in their tunnel/gate oxide.

BACKGROUND

During fabrication of semiconductor devices such as flash electrically erasable programmable read-only memories (EEPROM), various transistor designs having different properties are formed on a single die of a device. A single die may comprise high voltage complimentary metal oxide semiconductor (CMOS) devices, low voltage CMOS devices, and NAND cells. High voltage devices formed in the device periphery may comprise a thick gate oxide, for example to a thickness of about 20 nanometers (nm) or more, have an active area width of from about 0.5 microns (µ) to about 100µ, and have a gate length of from about 0.5µ to about 10µ with current technology. Low voltage devices formed in the periphery may comprise a gate oxide thickness of from about 5 nm to about 10 nm and have an active area width and a channel length which is about ⅕ the length of the high voltage devices, while NAND cells formed in the array have a tunnel oxide thickness similar to the low voltage devices, an active area length less than about 100 nm and a channel length of less than about 100 nm.

To form the gate oxide and tunnel oxide for the CMOS and NAND devices, a thick gate/tunnel oxide material suitable for high voltage CMOS devices is formed over the high and low CMOS device areas and the NAND device areas of the semiconductor wafer substrate assembly. Next, the high voltage CMOS areas are masked and etched to thin the gate/tunnel oxide over the low voltage CMOS device and NAND device areas. Device manufacture then continues to form floating gates for the NAND devices, and control gates for the NAND devices and the CMOS devices.

Transistor device reliability is a concern with semiconductor processing, particularly as device widths decrease. One reliability problem which occurs more frequently in miniaturized flash memory device transistors is degradation of the tunnel oxide during repeated program and erase cycles.

One method used to improve device reliability, particularly reliability of NAND cells, is nitridation of the tunnel oxide. This may be performed using nitridation or an anneal in an ambient comprising $NH_3$, NO, or $NO_2$ before forming the floating gates and control gates. Nitridation of the tunnel oxide is known to improve tunnel oxide reliability for NAND devices. However, nitridation of the gate oxide of high and low voltage CMOS devices which are also found on the device is not desirable. Nitridation of CMOS device gate oxide is known to degrade the mobility of electrons through the transistor channel region. Since the tunnel oxide of NAND devices found in the array and CMOS devices found in the periphery are formed at the same time, forming a concentration of nitrogen within the tunnel oxide without increasing the concentration within the gate oxide is difficult.

A method for forming CMOS and NAND devices having different nitrogen concentration profiles in the gate/tunnel oxide, and devices resulting from the process, would be desirable.

BRIEF DESCRIPTION OF THE DRAWINGS

FIGS. 1-5 are cross sections depicting a first embodiment of the disclosure, which forms high and low voltage CMOS transistors and floating gate transistors;

FIG. 6 depicts graphs of nitrogen concentrations at various device locations which may result from a process comprising the use of the first embodiment of the disclosure;

FIGS. 7-9 are cross sections depicting a second embodiment of the disclosure, which forms high and low voltage CMOS transistors and floating gate transistors;

FIG. 10 depicts graphs of nitrogen concentrations at various device locations which may result from a process comprising the use of the second embodiment of the disclosure;

FIGS. 11-15 are cross sections depicting a third embodiment of the disclosure, which forms high and low voltage CMOS transistors and floating gate transistors;

FIG. 16 depicts graphs of nitrogen concentrations at the various device locations depicted which may result from a process comprising the use of the third embodiment of the disclosure;

Figure 17:
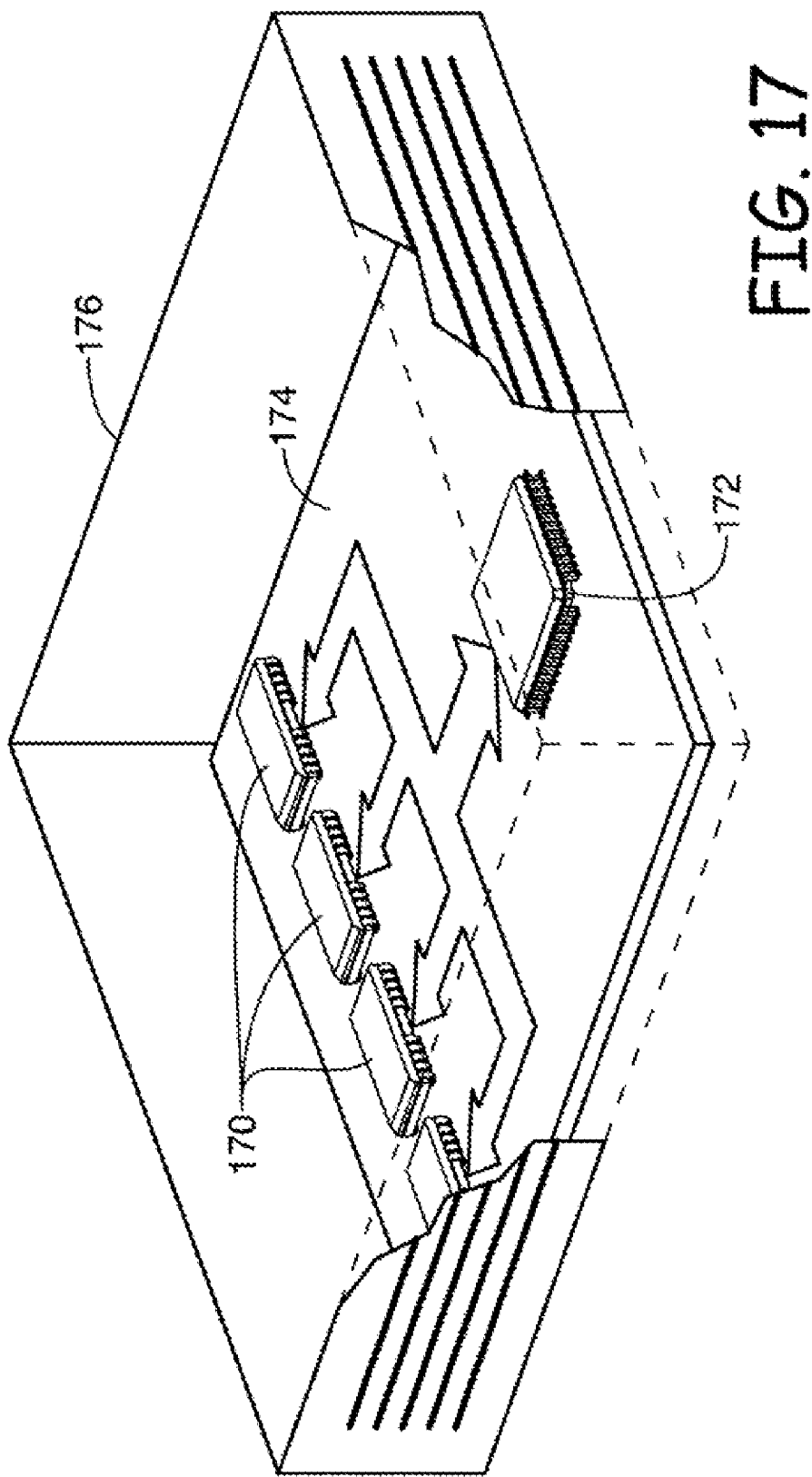
FIG. 17 is an isometric depiction of various components which may be manufactured using devices formed with an embodiment of the present invention.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial materials of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with materials including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two materials, one "on" the other, means at least some contact between the materials, while "over" means the materials are in close proximity, but possibly with one or more additional intervening materials such that contact is possible but not required. Neither "on" nor "over" implies any directionality as used herein unless otherwise stated. The term "conformal" describes a coating material in which angles of the underlying material are preserved by the conformal material. The term "about" indicates that the value listed may be somewhat altered, as long as the alteration does not result in nonconformance of the process or structure in question to the illustrated embodiment of the present invention. A "spacer" indicates a material, typically dielectric, formed as a conformal material over uneven topography then anisotropically etched to remove horizontal portions of the material and leaving vertical portions of the material.

FIGS. 1-4 depict a first embodiment of an inventive method used during semiconductor device fabrication, and depict a sectional view longitudinal with (i.e. in a direction parallel to) the transistor control gate (not depicted) and perpendicular with the active area length. These FIGS. depict a portion of a single memory chip during fabrication of a plurality of such devices on a single semiconductor wafer. FIG. 1 depicts a semiconductor wafer 10, non-nitrided oxide 12, and photoresist (resist) 14. FIG. 1 further depicts three separate areas on a single device, with area 16 being a high voltage CMOS device region, area 18 being a low voltage CMOS region, and area 20 being a NAND array region of the device. Oxide 12 will provide gate oxide for the high voltage CMOS devices, with the fabrication of gate oxide being known to those of ordinary skill in the art. As depicted in FIG. 1, the gate oxide at this point in fabrication with current device technology will be from about 200 Å to about 400 Å thick. The CMOS devices have a wider (and longer) active area than the NAND devices.

High voltage CMOS devices require a thicker gate oxide than either gate oxide of low voltage CMOS devices and tunnel oxide of NAND devices. After forming the FIG. 1 structure, which comprises non-nitridized gate and tunnel oxide, the exposed gate/tunnel oxide 12 of low voltage CMOS area 18 and NAND device area 20 is etched to expose the semiconductor wafer 10. Both wet and dry high voltage oxide etchants are known in the art, which will remove oxide and stop on the semiconductor wafer 10. Photoresist 14 protects the gate oxide of the high voltage region from the etchant.

Next, resist 14 is removed and oxide 22 is grown to provide gate oxide for the low voltage CMOS devices 18 and tunnel oxide for the NAND devices 20. Subsequently, a blanket (unpatterned) polysilicon material 24, blanket silicon nitride mask film 26, and photoresist 28 are deposited on (or above) areas 16, 18 and 20 respectively. Polysilicon 24 will function as the NAND device floating gate and as a portion of the high and low voltage CMOS gates. Silicon nitride mask film 26 will function as an etch stop during subsequent processing. Patterned photoresist 28 defines the transistor gate stacks for the CMOS transistors in areas 16, 18 and the NAND floating gates in area 20. While the width of resist 28 in the low voltage CMOS region 18 is depicted somewhat narrower than that in the high voltage CMOS region 16 and wider than the NAND gate region 20, the scaling is for illustration only and will be different than that depicted. Low voltage CMOS gates may be about ⅕ the width of high voltage CMOS devices, while NAND gates will be less than 1/10 the width of the low voltage CMOS gates.

Subsequently, an etch of the FIG. 2 structure is performed as known in the art to result in the FIG. 3 structure. As will be appreciated by one of ordinary skill in the art, this etch of blanket polysilicon material 24 defines the floating gates in the column direction, with the etch in the row direction to define each individual floating gate having yet to be performed. The width of the floating gates depicted may be less than about 100 nm wide. This etch further defines a portion of the polysilicon CMOS device gates, which may be between about 0.1 microns ($\mu$) and about 100$\mu$ wide. As well as defining the floating gates in the column direction and the CMOS control gates, this etch forms shallow trench isolation (STI) trenches 30 which will be filled later with isolation material.

Photoresist 28 is then removed and the structure of FIG. 3 is subjected to a nitridation process. This process may include annealing the FIG. 3 structure in a nitridation ambient comprising ammonia ($NH_3$), nitric oxide (NO), nitrogen dioxide ($NO_2$), or $NO/O_2$ at a temperature of between about 600° C. to about 1,100° C. for between about 60 seconds and 100 minutes. Alternately, the nitridation may be performed using plasma nitridation. During exposure, nitrogen is incorporated into the material at various locations of the FIG. 3 structure, to result in the nitrogen-rich areas 40 as depicted in FIG. 4. These nitrogen-rich locations form at exposed silicon and polysilicon location, and also at oxide-polysilicon interfaces. It should be noted that nitrogen may not be incorporated into each of the materials exactly as depicted in the FIGS. The FIGS. are intended as merely one possible resulting nitrogen profile. As previously stated, nitrogen is a desirable component within the tunnel oxide of NAND transistors, but is less desirable within the gate oxide of CMOS transistors. Due to the narrower width of the NAND transistors, the nitrogen is incorporated within the entire width of the tunnel oxide, but is incorporated into only a small portion of the width of the gate oxide of the CMOS transistors.

After nitridation, wafer processing may continue in accordance with conventional processing techniques to form the structure of FIG. 5. For example, shallow trench isolation such as oxide is formed within trenches 30, then a CMP process is performed to result in planarized STI 50. The silicon nitride 26 of FIG. 4 is removed, then another polysilicon material (not separately depicted) may be deposited and polished as part of the floating gates 24 in array area 20. The STI oxide in the array 20 is etched back to result in the STI 50 as depicted, while STI 50 in the CMOS areas 16, 20 remains unetched and at a level above the level of the floating gates 24. Next, capacitor dielectric 52 such as oxide-nitride-oxide (ONO) may be formed on the floating gates 24 in the array area 20 and on the polysilicon 24 in CMOS areas 16, 18. A polysilicon 54 may then be formed. Polysilicon 54 provides a second portion of the CMOS control gates for the CMOS devices in areas 16 and 18, and provides the floating gate transistor control gates overlying the floating gates 24 in the array area 20. FIG. 5 further depicts a conductive portion 56 electrically coupling the polysilicon gate material 24 to polysilicon material 54 in CMOS transistor areas 16, 18 to provide control gate polysilicon. It will be appreciated by one of ordinary skill in the art that portion 56 is a schematic representation of a feature such as a contact generally found at another location which electrically couples the polysilicon 24 with the polysilicon 54 of CMOS devices. Thus materials 24 and 54 together provide a single control gate for the CMOS devices, while material 24 provides at least a portion of a floating gate for the NAND devices and material 54 provide a control gate for the NAND devices. While feature 56 may not be found as depicted in FIG. 5 for a particular device, the depiction serves to illustrate that the material 24 which provides floating gates for the NAND devices and material 54 which provides control gates for the NAND devices are, in CMOS devices, electrically coupled together to provide a single conductive feature as a control gate. Silicon dioxide 58 may be formed over control gate polysilicon 54. After forming the FIG. 5 structure, further processing may be performed and other structures provided, such as patterning of the control gate polysilicon 54 and floating gate polysilicon 24 in the row direction, implantation of source-drain regions, BPSG formation and planarization, and formation of bit (digit) line contacts and bit lines, for example.

FIG. 6 depicts a representation of the nitrogen concentration (in atomic units) of the FIG. 5 structure across the width of the high voltage CMOS devices (FIG. 6A), the low voltage CMOS devices (FIG. 6B), and the NAND devices (FIG. 6C)

resulting from the process of FIGS. 1-4. Each gate is depicted above its respective graph to illustrate where the edges of the gate match the points on the graph. The concentration (FIGS. 6A & 6B) within the gate oxide of the CMOS devices is highest at the edge of the gate adjacent to the STI 50 and, in one embodiment, drops rapidly moving toward the center of the gate oxide under the floating gate. (For purposes of this disclosure, the "edge" of the gate refers to the edge of the gate adjacent to the STI, and "center" of the tunnel or gate dielectric refers to a midpoint of the dielectric located between the edges.) At the center of the CMOS devices, there is no elevation of the nitrogen concentration. With the NAND transistors, specifically as designated at location "a" of the graph FIG. 6C, the nitrogen concentration is highest at the edges but decreases by about 30% at the center of the tunnel oxide under the floating gate. In this embodiment, because the floating gate material has been etched only in one direction at the time of nitridation, the nitridation must reach the center of the tunnel oxide by entering from only two sides of the floating gate. With the floating gate widths, gate and tunnel oxide thicknesses, and nitridation process described above, the atomic percentage of nitrogen at the edges of the CMOS device gate oxide compared to the concentration at the center in one embodiment of a completed device is expected to be from about 10:1 or greater. That is, the nitrogen concentration at the edges of the gate oxide will be at least about 10 times the nitrogen concentration at the middle of the gate oxide. The peak atomic concentration of nitrogen in CMOS or cell oxides is expected to be between about 0.1% and about 10%. Further, the nitrogen concentration at the center of the tunnel oxide of the NAND gates is expected to be at least 10 times higher than the nitrogen concentration at the center of the gate oxide of the CMOS gates.

Other possible nitrogen concentration profiles using the embodiment of FIGS. 1-5 may be similar to that of either point "b" or point "c" FIG. 6C. Because nitrogen enters the tunnel oxide from two sides, with a long nitridation process, the nitride reaching the center of the gate region may become cumulative to provide a uniform nitrogen concentration across the tunnel oxide as depicted by line "b," or an elevated concentration depicted by line "c." One or more of the other embodiments described below may be modified to result in a nitrogen concentration described by lines "b" and "c" of FIG. 6C, and are similarly designated with analogous points "b" and "c" on FIGS. 10C and 16C.

FIGS. 7-10 depict a second embodiment of an inventive method used during semiconductor device fabrication, and depict a sectional view transverse with (i.e. in a direction perpendicular to) the control gate. These FIGS. depict a portion of a single memory chip during fabrication of a plurality of such devices on a single semiconductor wafer after formation of NAND floating gates and control gates, and CMOS control gates. Thus this nitridation is performed further along in the device fabrication process than the previous embodiments which was performed prior to fabrication of the NAND control gates.

FIG. 7 depicts a starting structure for the second embodiment of the disclosure, and may be manufactured by one of ordinary skill in the art. More particularly, FIG. 7 depicts a semiconductor wafer substrate assembly comprising semiconductor wafer 10 and three separate areas on a single device, with area 16 being a high voltage CMOS device region, area 18 being a low voltage CMOS device region, and area 20 being a NAND array region of the device. FIG. 7 further depicts non-nitrided gate oxide 60 for high voltage CMOS devices, non-nitrided gate oxide 62 for low voltage CMOS devices, and non-nitrided tunnel oxide 64 for NAND devices. With current device technology, gate oxide 60 will be from about 200 Å to about 400 Å thick, and each of gate oxide 62 and tunnel oxide 64 will be from about 50 Å to about 100 Å.

FIG. 7 further depicts transistor floating gates 66 and transistor control gates 68 separated by intergate dielectric 70 of each transistor gate stack. Additionally, FIG. 7 depicts dielectric capping material 72 such as silicon oxide or silicon nitride on each control gate.

FIGS. 7-9 depict a conductive portion 74 electrically coupling the floating gate 66 to the control gate 68 of the CMOS devices. As previously indicated, it will be appreciated by one of ordinary skill in the art that this is a schematic representation of a feature such as a contact generally found at another location which electrically couples the floating gate with the control gate of CMOS devices. While feature 74 may not be found as depicted in a particular device, the depiction serves to indicate that the materials formed as floating gates and control gate materials are, in CMOS devices, electrically coupled together to provide a single conductive feature, but provide two separate conductive features having a capacitance therebetween with NAND devices to provide storage of an electrical charge.

Subsequently, the FIG. 7 structure is subjected to a nitridation process to result in the structure of FIG. 8. The nitridation process may comprise the use of plasma nitridation or an anneal in a nitridation ambient comprising $NH_3$, NO, or $NO_2$ under conditions previously described. During the exposure, nitrogen is incorporated into the material at various exposed locations of the FIG. 7 structure, to result in the nitrogen-rich areas 76 as depicted in FIG. 8. These nitrogen-rich locations form within polysilicon and at oxide-polysilicon interfaces. As previously stated, nitrogen is a desirable component within the tunnel oxide of NAND transistors, but is less desirable within the gate oxide of CMOS transistors. Due to the shorter transistor gate length of the NAND transistors, the nitrogen is incorporated within the entire length of the tunnel oxide, but is incorporated into only a small portion of the length of the gate oxide of the CMOS transistors.

After performing the nitridation process, a source/drain implant is performed to result in the source/drain regions of FIG. 9, where 90 depicts NAND cell source/drains, 91 depicts low voltage CMOS source/drains, and 92 depicts high voltage CMOS source/drains. Wafer processing may then continue to form a completed device.

FIG. 10 depicts a representation of the nitrogen concentration across the channel length of the high voltage CMOS devices (FIG. 10A), the low voltage CMOS devices (FIG. 10B), and the NAND devices (FIG. 10C) resulting from the process of FIGS. 7-9. The concentration within the gate oxide of the CMOS devices is highest at locations not covered by the floating gate polysilicon 66 and drops rapidly moving toward the center of the gate oxide under the floating gate. In one embodiment, there is no elevated nitrogen concentration within the gate oxide at the center of the CMOS devices (10A & 10B). In another embodiment (10C), the nitrogen concentration in the gate oxide at the edges of the CMOS devices is at least 10 times the concentration in the gate oxide centered under the floating gate polysilicon. With the NAND transistors, particularly at line "c" of FIG. 10C, the concentration is highest at the edges and maintains a relatively high level even at the center of the tunnel oxide under the floating gate, decreasing only by about 6% or less at the center of the tunnel oxide under the floating gate, due to the narrower width of the floating gate polysilicon and control gate polysilicon. In this embodiment, the floating gate has been etched in both directions prior to nitridation, and nitrogen may therefore reach the tunnel oxide from four sides of the floating gate (with two sides being open and two sides covered by the control gate polysilicon). With the floating gate widths, gate and tunnel oxide thicknesses, and nitridation process described above, the atomic percentage of nitrogen at the edges of the CMOS device gate oxide compared to the concentration at the center in one embodiment of a completed device is expected to be from about 10:1 or greater. That is, the nitrogen concentration at the edges of the gate oxide will be at least 10 times the nitrogen concentration at the middle of the gate oxide. The peak atomic concentration of nitrogen in CMOS or cell oxides is expected to be from about 0.1% to about 10%. Further, the nitrogen concentration at the center of the tunnel oxide of the NAND gates is expected to be at least 10 times higher than the nitrogen concentration at the center of the gate oxide of the CMOS gates. In another embodiment, depicted by line "b" of FIG. 10C, nitrogen enters the tunnel oxide from both sides of floating gate 66, and becomes cumulative at the center such that the nitrogen concentration is relatively uniform across the tunnel oxide under the floating gate. In yet another embodiment, depicted by line "c" of FIG. 10C, the accumulation of nitrogen at the center of the tunnel oxide under the floating gate exceeds that of the edges, such that the concentration at the center is higher than at the edges.

After forming the FIG. 9 structure, wafer processing may continue according to techniques known in the art to form a completed semiconductor device.

FIGS. 11-15 depict a third embodiment of the disclosure. The structure of FIG. 11 comprises a semiconductor wafer 10 and three separate areas on a single device, with area 16 being a high voltage CMOS device region, area 18 being a low voltage CMOS device region, and area 20 being a NAND array region of the device. FIG. 11 further depicts non-nitrided gate oxide 60 for high voltage devices, non-nitrided gate oxide 62 for low voltage CMOS devices, and non-nitrided tunnel oxide 64 for NAND devices. Further depicted is unpatterned blanket floating gate polysilicon 24, shallow trench isolation (STI) 100, and patterned photoresist (resist) 102. It should be noted that the FIG. 11 structure may comprise other features which are not immediately germane to the present invention and which are not depicted for simplicity of explanation.

After forming the FIG. 11 structure, the floating gate material 24 is etched using resist 102 as a pattern to result in the FIG. 12 structure. At this point in the manufacturing process, the floating gate polysilicon in the CMOS areas is not etched. After patterning the floating gate polysilicon 24 of the NAND devices, the resist 102 may be removed to result in the FIG. 13 structure.

The FIG. 13 structure is subjected to a nitridation process resulting in the structure of FIG. 14. The nitridation process may comprise the conditions described for prior embodiments, i.e. exposing the FIG. 13 structure to a nitridation ambient comprising ammonia ($NH_3$), nitric oxide (NO), nitrogen dioxide ($NO_2$), or $NO/O_2$ at a temperature of from about 600° C. to about 1100° C. for about 60 seconds to 100 minutes. Alternately, the nitridation may be performed using plasma nitridation. During the exposure, nitrogen is accepted at various exposed locations of the FIG. 13 structure, to result in the nitrogen-rich areas 130 as depicted in FIG. 14. These nitrogen-rich locations form within polysilicon and at oxide-polysilicon interfaces. As previously stated, nitrogen is a desirable component within the tunnel oxide of NAND transistors, but is less desirable within the gate oxide of CMOS transistors. Due to the floating gate polysilicon 24 which covers CMOS device areas 16, 18, nitrogen is prevented from reaching the gate oxide 60, 62. The floating gate polysilicon of the CMOS devices areas will be patterned during patterning of the transistor control gates for both the CMOS and NMOS devices.

After nitridation of the FIG. 14 structure, wafer processing may continue in accordance with conventional techniques. For example, FIG. 15 depicts the FIG. 14 structure after subsequent formation of other structures including, but not limited to: capacitor dielectric 150 such as a silicon nitride material interposed between two silicon dioxide materials (i.e. "ONO"); a polysilicon material 152 which forms transistor control gates for the NAND devices and which forms a portion of the CMOS device control gate in conjunction with material 24; and a silicon dioxide capping material 154.

FIG. 16 depicts a representation of the nitrogen concentration across the width of the high voltage CMOS devices (FIG. 16A), the low voltage CMOS devices (FIG. 16B), and the NAND devices (FIG. 16C) resulting from the process of FIGS. 11-15. This process does not contribute to increasing nitrogen concentration within the gate oxide 60, 62 of the CMOS devices, thus no nitrogen concentration is depicted in FIGS. 16A and 16B. With the NAND transistors represented in FIG. 16C, particularly at line "a," the concentration is highest at the edges but decreases by about 30% at the center of the tunnel oxide under the floating gate. In this embodiment, as with the first embodiment, the floating gate material has been etched only in one direction and the nitridation may reach the center of the tunnel oxide by entering from only two sides of the floating gate. This process does not increase, or only minimally increases, the concentration of nitrogen within the gate oxide of the CMOS devices. It is expected that the concentration of nitrogen within the gate oxide of CMOS devices will not increase because of the process of this embodiment. The peak atomic concentration of nitrogen in NAND device tunnel oxide is expected to be between about 0.1% and about 10%. As with previous embodiments, the nitrogen concentration at the center of the tunnel oxide of the NAND gates is expected to be at least 10 times higher than the nitrogen concentration at the center of the gate oxide of the CMOS gates. In another embodiment, depicted by line "b" of FIG. 16C, nitrogen enters the tunnel oxide from both sides of floating gate 66, and becomes cumulative at the center such that the nitrogen concentration is relatively uniform across the tunnel oxide under the floating gate. In yet another embodiment, depicted by line "c" of FIG. 16C, the accumulation of nitrogen at the center of the tunnel oxide under the floating gate exceeds that of the at the edges, such that the concentration at the center is higher than at the edges.

As depicted in FIG. 17, a semiconductor device 170 formed in accordance with an embodiment of the disclosed invention may be attached along with other devices such as a microprocessor 172 to a printed circuit board 174, for example to a computer motherboard or as a part of a memory module used in a personal computer, a minicomputer, or a mainframe 176. FIG. 17 may also represent use of device 170 in other electronic devices comprising a housing 176, for example devices comprising a microprocessor 172, related to telecommunications, the automobile industry, semiconductor test and manufacturing equipment, consumer electronics, or virtually any piece of consumer or industrial electronic equipment.

Figure 18:
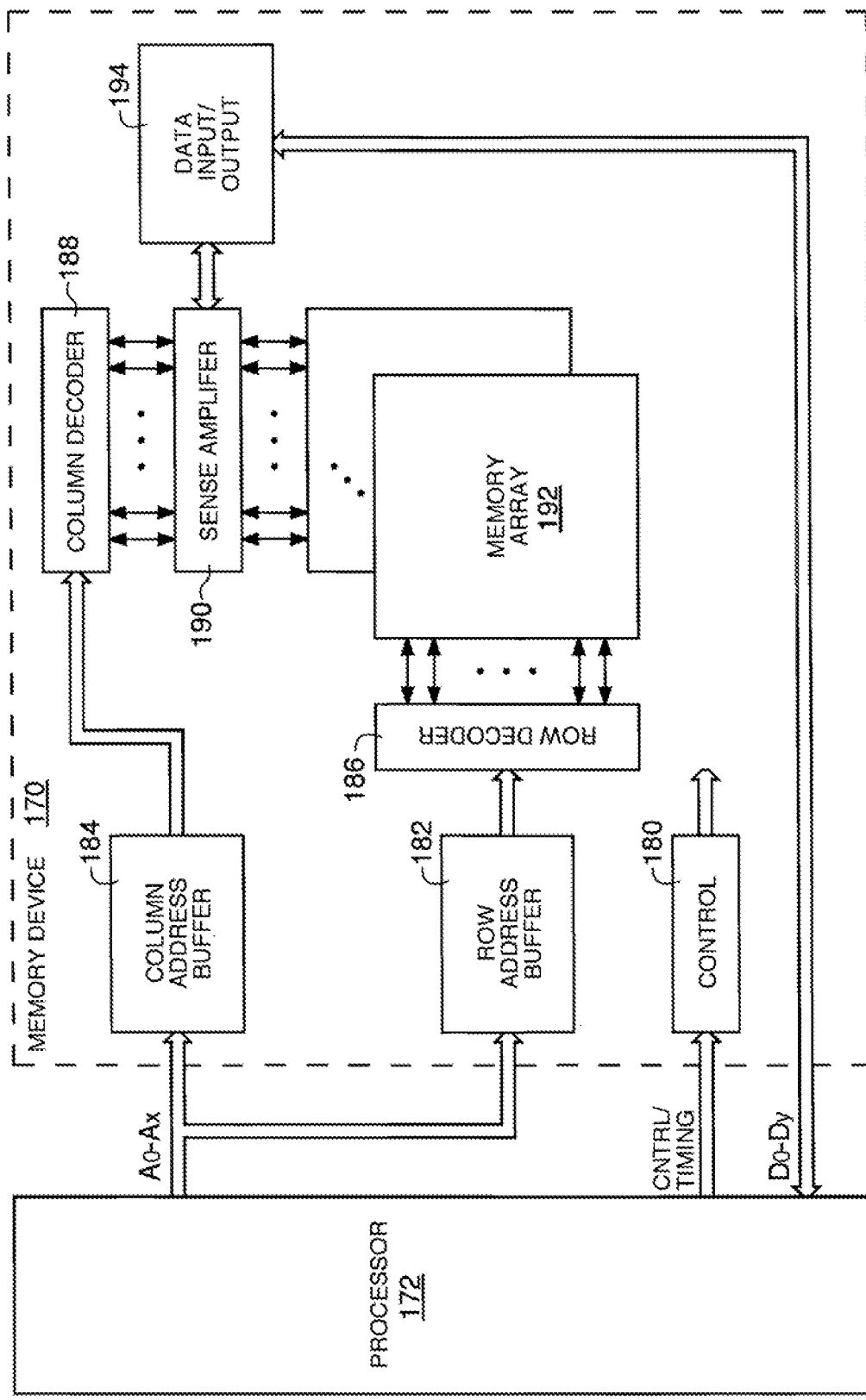
FIG. 18 is a block diagram of an embodiment of the invention to form part of a memory device having a storage transistor array.

The process and structure described herein can be used to manufacture a number of different structures comprising metal formed according to the inventive process to result in a densified metal having decreased resistance and reduced contamination compared with conventional materials. FIG. 18, for example, is a simplified block diagram of a memory device such as a dynamic random access memory having container capacitors and other features which may be formed using an embodiment of the present invention. The general operation of such a device is known to one skilled in the art. FIG. 18 depicts a processor 172 coupled to a memory device 170, and further depicts the following basic sections of a memory integrated circuit: control circuitry 180; row address buffer 182; column address buffer 184; row decoder 186; column decoder 188; sense amplifiers 190; memory array 192; and data input/output 194.

While this disclosure has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the disclosure.

The invention claimed is:

1. A method of semiconductor device manufacture, comprising:
   forming a first transistor gate stack comprising:
      gate dielectric; and
      an active area having a first width;
   forming a second transistor gate stack comprising:
      a non-nitridized tunnel dielectric; and
      a conductive floating gate and active area having a second width which is less than the first width; and
   simultaneously exposing the first and second transistor gate stacks to a nitridation ambient resulting in a higher nitrogen concentration at a center of the tunnel dielectric than at a center of the gate dielectric.

2. The method of claim 1 further comprising exposing the first and second transistor gate stacks to the nitridation ambient such that the nitrogen concentration at the center of the tunnel dielectric is at least ten times the nitrogen concentration at the center of the gate dielectric.

3. The method of claim 1 further comprising:
   forming first and second dielectric materials and a conductive material over a semiconductor wafer;
   etching the first and second dielectric materials, the conductive material, and the semiconductor wafer to form the first and second transistor gate stacks and to etch at least one recess within the semiconductor wafer; and
   after etching the conductive material, exposing the semiconductor wafer to the nitridation ambient during the exposure of the first and second transistor gate stacks to the nitridation ambient,
   wherein the exposure of the semiconductor wafer to the nitridation ambient forms a region within the semiconductor wafer having an increased concentration of nitrogen.

4. The method of claim 3 further comprising forming shallow trench isolation material within the at least one recess within the semiconductor wafer and over at least a portion of the region within the semiconductor wafer having the increased concentration of nitrogen.

5. The method of claim 1 further comprising exposing the first and second transistor gate stacks to the nitridation ambient to result in the nitrogen concentration at an edge of the gate dielectric of at least 10 times the nitrogen concentration at the center of the gate dielectric.

6. The method of claim 1 further comprising exposing the first and second transistor gate stack to the nitridation ambient to result in a nitrogen concentration at an edge of the tunnel dielectric and the nitrogen concentration at the center of the tunnel dielectric varying by about 6% or less.

7. The method of claim 1 further comprising exposing the first and second transistor gate stack to the nitridation ambient to result in a nitrogen concentration at the center of the tunnel dielectric of at least the nitrogen concentration at an edge of the tunnel dielectric.

8. The method of claim 1 further comprising:
   during the formation of the first transistor gate stack, forming a non-nitridized gate dielectric; and
   during the formation of the second transistor gate stack, forming the non-nitridized tunnel dielectric.

9. A method of semiconductor device manufacture, comprising:
   forming a patterned conductive floating gate material over a gate dielectric at a CMOS transistor gate region and over a tunnel dielectric at a NAND transistor gate region;
   forming a patterned conductive control gate material such that after patterning and removal of a portion of the conductive control gate material, the patterned conductive control gate material is over the conductive floating gate material at the CMOS transistor gate region and at the NAND transistor gate region;
   electrically coupling the patterned conductive floating gate material and the patterned conductive control gate material at the CMOS transistor gate region; and
   simultaneously exposing the patterned conductive floating gate material at the CMOS transistor gate region and at the NAND transistor gate region to a nitridation ambient to result in a higher nitrogen concentration at a center of the tunnel dielectric than at a center of the gate dielectric.

10. The method of claim 9 further comprising exposing the patterned conductive floating gate material at the CMOS transistor gate region and at the NAND transistor gate region to the nitridation ambient such that the nitrogen concentration at the center of the tunnel dielectric is at least 10 times the nitrogen concentration at the center of the gate dielectric.

11. The method of claim 9 further comprising exposing the patterned conductive floating gate material at the CMOS transistor gate region and at the NAND transistor gate region to the nitridation ambient to result in the nitrogen concentration at an edge of the gate dielectric being at least 10 times the nitrogen concentration at the center of the gate dielectric.

12. The method of claim 9 further comprising exposing the patterned conductive floating gate material at the CMOS transistor gate region and at the NAND transistor gate region to the nitridation ambient to result in a nitrogen concentration at an edge of the tunnel dielectric and the nitrogen concentration at the center of the tunnel dielectric varying by about 6% or less.

13. The method of claim 9 further comprising exposing the patterned conductive floating gate material at the CMOS transistor gate region and at the NAND transistor gate region to the nitridation ambient to result in a nitrogen concentration at a center of the tunnel dielectric which is at least as high as a nitrogen concentration at an edge of the tunnel dielectric.

14. The method of claim 9 further comprising:
   forming a non-nitridized gate dielectric at the CMOS transistor gate region; and
   forming a non-nitridized tunnel dielectric at the NAND transistor gate region.

15. A method of semiconductor device manufacture, comprising:
   forming a high voltage CMOS transistor gate stack comprising:
      gate dielectric having a first thickness; and
      a conductive gate;
   forming a low voltage CMOS transistor gate stack comprising:

gate dielectric having a second thickness which is less than the first thickness; and a conductive gate;

forming a floating gate transistor gate stack comprising:

a non-nitridized tunnel dielectric having a third thickness which is less than the first thickness and equal to or less than the second thickness; and a conductive floating gate; and simultaneously exposing the high voltage CMOS transistor gate stack, the low voltage CMOS transistor gate stack, and the floating gate transistor gate stack to a nitridation ambient to result in a higher nitrogen concentration at a center of the tunnel dielectric than at a center of the gate dielectric.

16. The method of claim 15 further comprising exposing the high voltage CMOS transistor gate stack, the low voltage CMOS transistor gate stack, and the floating gate transistor gate stack to the nitridation ambient such that the nitrogen concentration at the center of the tunnel dielectric is at least 10 times the nitrogen concentration at the center of the gate dielectric.

17. The method of claim 15 further comprising:

forming the gate dielectric having the first thickness over a semiconductor wafer substrate assembly;

removing the gate dielectric having the first thickness from low voltage CMOS transistor gate stack regions and from floating gate transistor gate stack regions;

forming the gate dielectric having the second thickness and the tunnel dielectric having the third thickness over the semiconductor wafer substrate assembly;

forming a blanket conductive material over a semiconductor wafer substrate assembly;

etching the blanket conductive material, the gate dielectric having the first and second thicknesses, and the tunnel dielectric to form at least a portion of the high voltage CMOS transistor gate stack, the low voltage CMOS transistor gate stack, and the floating gate transistor gate stack;

etching the semiconductor wafer substrate assembly to form at least one recess therein;

exposing the semiconductor wafer substrate assembly to the nitridation ambient during the exposure of the high and low voltage transistor gate stacks and the floating gate transistor gate stacks to the nitridation ambient, wherein the exposure of the semiconductor wafer to the nitridation ambient forms a region within the semiconductor wafer having an increased concentration of nitrogen.

18. The method of claim 17 further comprising forming shallow trench isolation material within the at least one recess within the semiconductor wafer and over the region within the semiconductor wafer substrate assembly having the increased concentration of nitrogen.

19. The method of claim 15 further comprising exposing the high voltage CMOS transistor gate stack and the low voltage CMOS transistor gate stack to the nitridation ambient to result in the nitrogen concentration at an of the gate dielectric being at least 10 times the nitrogen concentration at the center of the gate dielectric.

20. The method of claim 15 further comprising exposing the floating gate transistor gate stack to the nitridation ambient resulting in a nitrogen concentration at an edge of the tunnel dielectric and the nitrogen concentration at the center of the tunnel dielectric varying by about 6% or less.

21. The method of claim 15 further comprising:

during the formation of the high voltage CMOS transistor gate stack, forming a non-nitridized gate dielectric having the first thickness;

during the formation of the low voltage CMOS transistor gate stack, forming a non-nitridized gate dielectric having the second thickness; and during the formation of the floating gate transistor gate stack, forming the non-nitridized tunnel dielectric having the third thickness.

* * * * *